United States Patent [19]
Yanagisawa et al.

[11] Patent Number: 5,228,370
[45] Date of Patent: Jul. 20, 1993

[54] METHOD OF MANUFACTURING MOLDING MATERIAL CONTAINING METAL FIBERS AND APPARATUS THEREFOR

[75] Inventors: Akira Yanagisawa, Miyashiro; Teruo Okano, Honjo, both of Japan

[73] Assignee: Nibex Company, Ltd., Tokyo, Japan

[21] Appl. No.: 824,877

[22] Filed: Jan. 24, 1992

Related U.S. Application Data

[63] Continuation of Ser. No. 524,984, May 18, 1990, abandoned.

[30] Foreign Application Priority Data

May 19, 1989 [JP] Japan .................. 1-124533
May 29, 1989 [JP] Japan .................. 1-132566

[51] Int. Cl.$^5$ ............................................ B23B 3/00
[52] U.S. Cl. ............................. 82/1.11; 156/250; 156/255; 156/267; 523/137; 524/439; 524/440; 524/508; 524/577; 524/584
[58] Field of Search ............. 156/195, 193, 191, 187, 156/188, 250, 255, 267; 82/1.11; 523/137

[56] References Cited

U.S. PATENT DOCUMENTS

| | | | |
|---|---|---|---|
| 3,697,348 | 7/1969 | Farnam | 156/193 |
| 3,791,898 | 2/1974 | Remi | 156/188 |
| 4,070,214 | 1/1978 | Brown et al. | 156/47 |
| 4,416,721 | 11/1983 | Deregibus | 156/428 |

FOREIGN PATENT DOCUMENTS

| | | | |
|---|---|---|---|
| 55-095520 | 7/1980 | Japan | 82/1.11 |
| 2-243201 | 9/1990 | Japan | 82/1.11 |

Primary Examiner—John C. Bleutge
Assistant Examiner—Mark Sweet
Attorney, Agent, or Firm—Pollock, VandeSande & Priddy

[57] ABSTRACT

A method of manufacturing a molding material includes the steps of winding a thin metal strip on the peripheral surface of a rotary shaft a plurality of turns with a resin material being interposed between the resulting layers of metal, cutting an end surface of the metal strip and the resin material which have been wound by a cutting blade while rotating said rotary shaft to obtain a mixture of metal fibers and resin fibers, and heating the fiber mixture to a temperature at which the resin fibers can be softened. In this way, a molding material in which the metal fibers are substantially uniformly dispersed in the resin material in a closely contacted state can be obtained easily. Furthermore, the contents of the metal fibers by volume in the molding material can be arbitrarily adjusted by changing the rate at which the metal strip and the resin material are wound around the rotary shaft.

12 Claims, 5 Drawing Sheets

METHOD OF MANUFACTURING MOLDING MATERIAL CONTAINING METAL FIBERS AND APPARATUS THEREFOR

This application is a continuation of Ser. No. 07/524,984 filed on May 18, 1990, now abandoned.

BACKGROUND OF THE INVENTION

1. Field of the Invention

The present invention relates to a method of manufacturing a molding material in which a large number of metal fibers are dispersed in a resin material and an apparatus therefore.

2. Description of the Related Art

In order to prevent leakage of or invasion of electromagnetic waves, electronic or electric devices have a casing which is made of a conductive resin material capable of shielding them against electromagnetic waves.

Such a casing is generally manufactured by molding master pellets which are a molding material containing metal fiber or a mixture of those master pellets and natural pellets of the same resin using an adequate molding machine or a die.

Various methods of manufacturing the master pellets containing metal fibers are known. In one of them, metal fibers and natural pellets are extruded from an extruder while being heated and mixed with each other, the extruded articles being cut into an adequate length. In another method, a resin is coated on the periphery of a bundle of metal fibers using an extruder, the extruded articles being cut into an adequate length (proposed in Japanese Patent Laid-Open No. 18315/1985). In still another method, metal fibers are dipped in a resin solution so as to impregnate the metal fibers with the resin, and the same resin is then coated on the periphery of the metal fibers after they have been dried using an extruder, the extruded articles being cut into an adequate length (disclosed in Japanese Patent Publication No. 26783/1988).

However, in the manufacturing method in which the metal fibers and the natural pellets are heated and mixed, since it is very difficult for the metal fibers to be uniformly dispersed in the natural pellets during the mixture, variations in the density of fibers contained in the extruded articles easily occur. Also, since long metal fibers cannot be used due to prevention of bending of the metal fibers and intertwinement of the bending metal fibers, the resultant extruded articles cannot be made sufficiently conductive.

In the manufacturing method in which a resin is coated on the periphery of the bundle of metal fibers, since the bundle of metal fibers is not easily impregnated with the resin, cracking of the coated resin or removal of the metal fibers easily occur during the cutting operation. These make manufacture of master pellets which are satisfactory as a molding material impossible.

In the manufacturing method in which the bundle of metal fibers is impregnated with resin, the amount of resin impregnated differs greatly depending on the density at which the bundle of metal fibers is converged. In consequence, manufacture of master pellets containing metal fibers at a predetermined rate is difficult, and production cost is increased due to a large number of manhours.

SUMMARY OF THE INVENTION

A primary object of the present invention is to provide an easy manufacturing method of a molding material or master pellets in which metal fibers are dispersed uniformly and contained at a predetermined rate.

In order to achieve the aforementioned primary object, the present invention provides in one of its aspects a method of manufacturing a molding material which comprises the steps of winding a thin metal strip on the peripheral surface of a rotary shaft a number of turns with a resin material therebetween, cutting an end surface of the wound metal strip with the resin material by a cutting blade while rotating the rotary shaft to obtain a mixture of metal fibers and resin fibers, and heating the mixture to a temperature at which the resin fibers can be softened.

According to the above-described aspect of the present invention, the fiber mixture in which the metal fibers and the resin fibers are present in a mixed state is heated to a temperature at which the resin fibers can be softened. In consequence, a molding material in which the metal fibers are substantially uniformly dispersed in the resin material in a closely contacted state can be easily manufactured. Furthermore, the contents of the metal fibers by volume in the molding material can be arbitrarily adjusted by changing the rate at which the metal strip and the resin material wound around the rotary shaft.

When the casings or the like provided with the electromagnetic wave shielding function are to be manufactured using the thus-obtained molding material, the molding material is first cut into a predetermined length and is thereby formed into pellets, namely master pellets. Thereafter, the master pellets containing the metal fibers or a mixture obtained by mixing these master pellets and natural pellets of the same resin is then molded into a predetermined form using an adequate molding machine or a die. Since the molding material has a form in which the metal fibers are substantially uniformly dispersed in a resin matrix, cracking of the resin material or removal of the metal fibers does not occur during the cutting operation performed to obtain the master pellets. Furthermore, when the master pellets are to be mixed with the natural pellets, the metal fibers can be sufficiently dispersed in the resultant mixture, and desired conductive molded articles can thus be provided. Furthermore, since the length of the metal fibers which are present in the master pellets obtained by cutting the molding material into a predetermined length is equal to that of the pellets, the metal fibers are present in the molded articles in a sufficiently coupled or intertwined state. This greatly improves the conductivity of the molded articles.

A second object of the present invention is to provide a manufacturing apparatus which is suitable for use in carrying out the aforementioned manufacturing method and which has a simple structure.

In order to achieve the second object, the present invention provides in another of its aspects an apparatus for manufacturing a molding material which comprises a cutting device for generating a fiber mixture, and a heating device for heating the fiber mixture. The cutting device includes a rotary shaft rotatably supported on an upper surface of a bed, a first rotation transmission means for transmitting a rotation of a driving source to the rotary shaft, a winding portion provided on the rotary shaft, the winding portion having a cylindrical outer surface which is coaxial with the rotary shaft and around which a thin metal strip can be wound a number of turns with a resin material therebetween, a tool post with a cutting blade which faces an end surface of the metal strip and the resin material which are wound around the winding portion, the tool post being capable of moving parallel to an axis of the rotary shaft, a second rotation transmission means for transmitting a rotation of the rotary shaft to a feed screw through a reduction gear, and a nut fixed to the tool post, the nut being in engagement with the feed screw. The heating device includes a passage through which the fiber mixture generated by the cutting device passes, and a heating means for heating the fiber mixture which passes through the passage to a temperature at which resin fibers can be softened.

According to the above-described another aspect of the present invention, the aforementioned manufacturing method can be carried out appropriately. Furthermore, since the cutting device employs the single driving source to rotate the rotary shaft, i.e., to achieve rotation of the materials which are wound, and to move the cutting blade in synchronism with the rotation of the rotary shaft, the structure of the device can be simplified. Furthermore, the rotation of the rotary shaft is also transmitted to the feed screw through a reduction gear, which in turn moves the cutting blade. In consequence, the feeding of the cutting blade can be set finely, and fine metal fibers which are suitable for use in the molding material can thus be generated. Furthermore, in the heating device, the resin fibers in the fiber mixture which passes through the passage can be heated and thereby softened quickly and effectively.

A third object of the present invention is to provide a method of manufacturing a molding material more simply.

In order to achieve the third object, the present invention provides in another of its aspects a method of manufacturing a molding material which comprises the steps of winding a thin metal strip on the peripheral surface of a rotary shaft a number of turns with a resin material being interposed therebetween, the resin material being the one that can be softened by the cutting heat, and cutting an end surface of the wound metal strip with the resin material by a cutting blade while rotating the rotary shaft to obtain a fiber mixture of metal fibers and resin fibers.

According to the above-described another aspect of the present invention, since the metal fibers are bonded to the resin material utilizing the cutting heat, the heating process can be eliminated, thereby simplifying the manufacturing process.

Other and further objects, features and advantages of the invention will be apparent from the following description taken in connection with the accompanying drawings.

DETAILED DESCRIPTION OF THE PREFERRED EMBODIMENT

Figure 1:
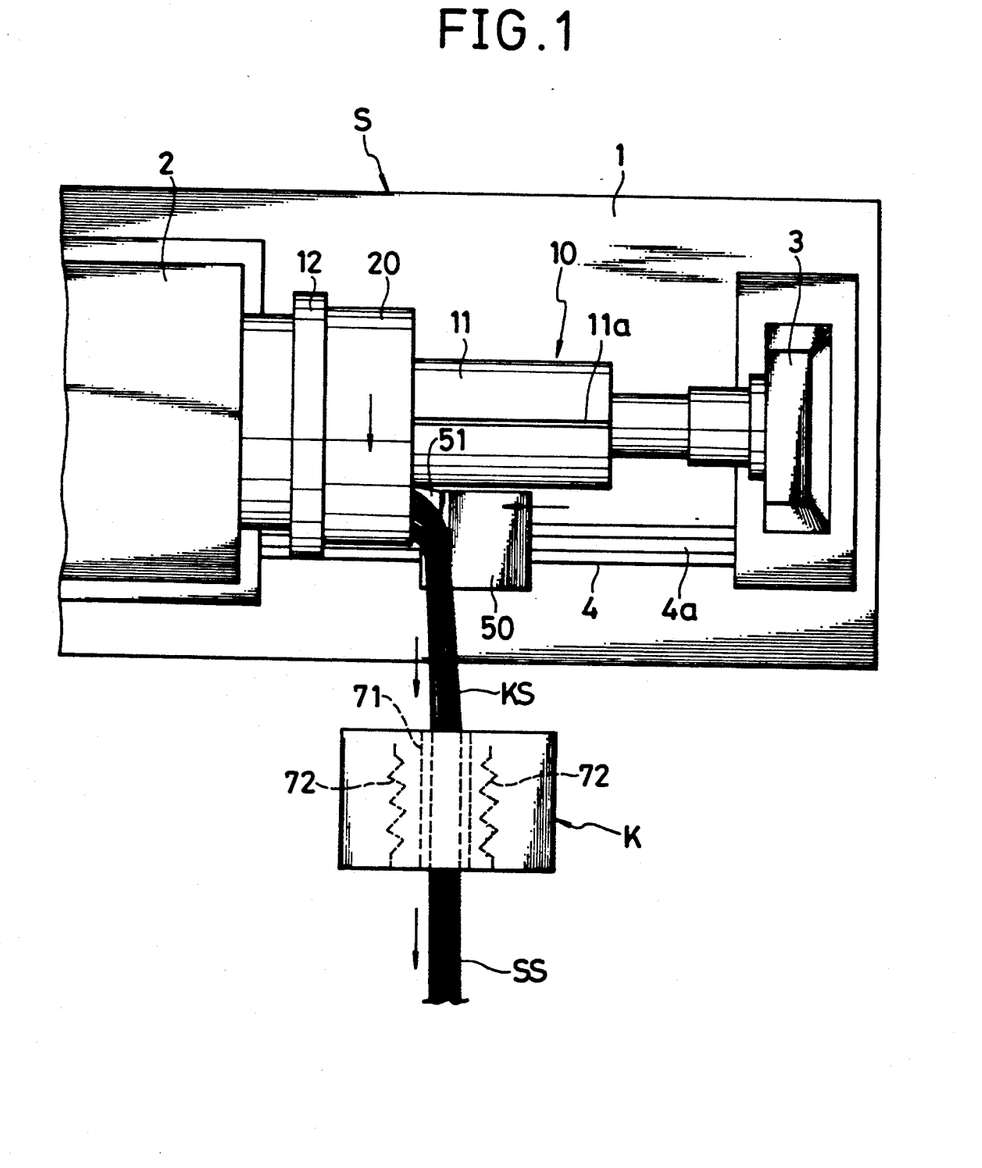
FIG. 1 is a plan view of an embodiment of an apparatus of manufacturing a molding material according to the present invention.

FIG. 1 shows an embodiment of a manufacturing apparatus according to the present invention. This manufacturing apparatus includes a cutting device S for generating a mixture of metal fibers and resin fibers, and a heating device K for heating the mixture of metal fibers and resin fibers.

First, the cutting device S will be described in detail with reference to FIGS. 1 to 6.

Figure 2:
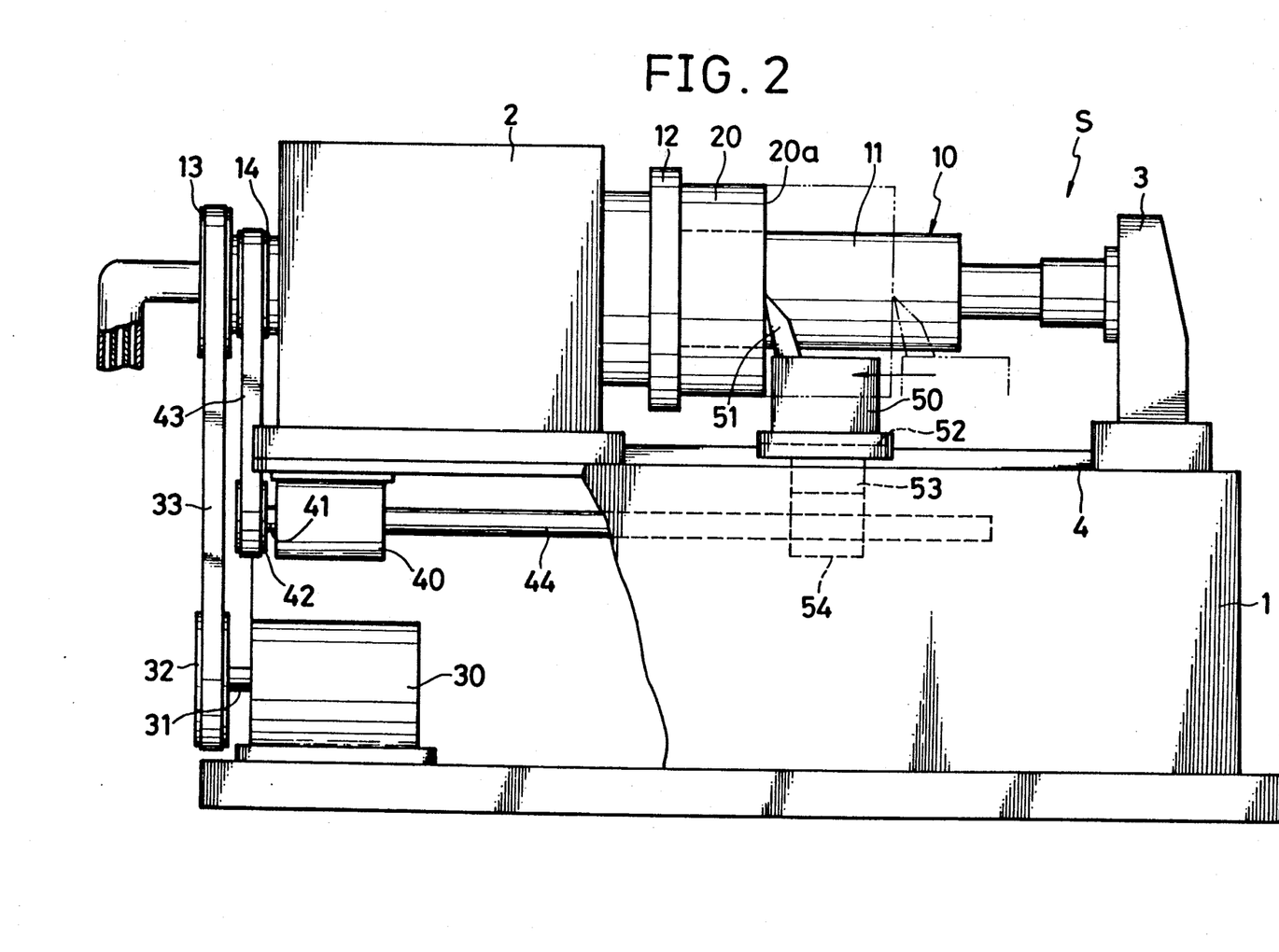
FIG. 2 is a side elevational view of a cutting device of the apparatus.

The cutting device S has a hollow square bed 1 that can be placed on a floor or the like. On the upper surface of the bed 1 are provided a bearing base 2 and a supporting base 3. Both the bearing base 2 and the supporting base 3 accommodate bearings (not shown) therein. The bearing base 2 and the supporting base 3 are separated from each other by a predetermined interval and disposed such that the bearings accommodated therein are positioned on the same axis.

Figure 3:
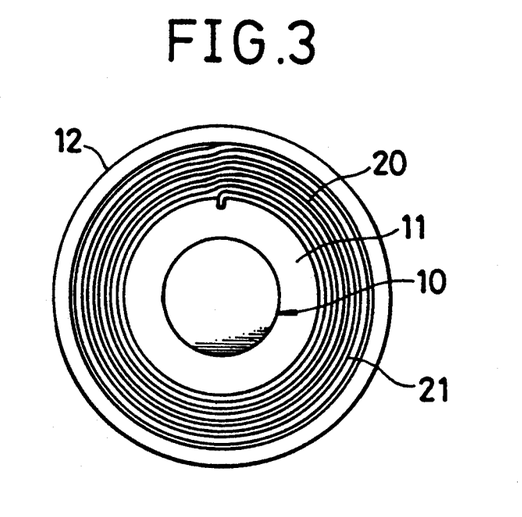
FIG. 3 is a front view of a rotary shaft.

The cutting device S also includes a rotary shaft 10. One end of the rotary shaft 10 is rotatably supported by the supporting base 3, and the other end thereof is rotatably supported by the bearing base 2. The portion of the rotary shaft 10 located between the bearing base 2 and the supporting base 3 forms a winding portion 11 having a cylindrical outer surface and a large-diameter collar portion 12. The winding portion 11 is coaxial with respect to the rotary shaft 10 and has a groove 11a along an axis thereof on the outer surface thereof. The large-diameter collar portion 12 is located on the side of the winding portion 11 close to the bearing base 2. Two pulleys 13 and 14 having different diameters are coaxially mounted on the portion of the rotary shaft 10 which projects from the bearing base 2.

A metal plate 20 is wound around the peripheral surface of the winding portion 11 with a resin film 21 therebetween. A detailed description of the metal plate 20, the resin film 21 and the winding method will now be given below with reference to FIG. 3.

The metal plate 20 is made of brass and has a thickness of 100 μm and a width of about 100 mm. The resin film 21 is made of a resin having a softening point which is higher than the cutting temperature (the temperature of the cut portion due to the cutting heat) and which is about 150° C., e.g., a thermosetting phenolic resin. The resin film 21 has a thickness of 100 μm and the same width as that of the metal plate 20.

When the metal plate 20 and the resin film 21 are to be wound around the winding portion 11, the metal plate 20 and the resin film 21 are first laminated. Next, the end portion of the laminate is inserted into the groove 11a and thereby bent. Thereafter, the laminate of the metal plate 20 and the resin film 21 is wound tightly a plurality of turns clockwise as viewed in FIG. 3 with the resin film 21 being located below the metal plate 20 and with one edge of the metal plate 20 and the resin film 21 being in contact with the side surface of the collar portion 12. After the laminate of the metal plate 20 and the resin film 21 has been built up to a predetermined diameter by winding, it is cut, and the end portion thereof is then fixed to the surface thereof using an adhesive or by means of the spot welding or laser welding.

Inside the bed 1, a motor 30 is fixed to the bottom thereof. The motor 30 has a rotary shaft 31 to which a pulley 32 is fixed. The pulley 32 is coupled to the pulley 13 of the rotary shaft 10 by means of a belt 33, by means of which the rotary shaft 10 can be rotated by the operation of the motor 30.

The bed 1 also accommodates a reduction gear 40. The reduction gear 40 is fixed to the undersurface of the upper surface of the bed 1, and houses therein a connection means, such as an electromagnetic clutch (not shown). The reduction gear 40 has an input shaft 41 to which a pulley 42 is fixed. The pulley 42 is coupled to the pulley 14 of the rotary shaft 10 by means of a belt 43, by which rotation of the rotary shaft 10 is transmitted to the input shaft 41 of the reduction gear 40. The reduction gear 40 also has an output shaft (not shown), to which a feed screw 44 which is parallel to the rotary shaft 10 is coupled.

A tool post 50 with a cutting blade 51 made of high speed steel or a sintered hard alloy is provided on the upper surface of the bed 1. The tool post 50 has on the under surface thereof a guide groove 52 which is slidably fitted with a guide rail 4 disposed on the upper surface of the bed 1 parallel to the axis of the rotary shaft 10. The tool post 50 also has a leg plate 53 on the under surface thereof. The leg plate 53 passes through a slit 4a formed in the guide rail 4 and protrudes downwardly. A feed nut 54 which is threadedly engaged with the feed screw 44 is fixed to the leg plate 53, by means of which the tool post 50 can be moved on the upper surface of the bed 1 along the guide rail 4 parallel to the axis of the rotary shaft 10 by the rotation of the feed screw 44.

Figure 4:
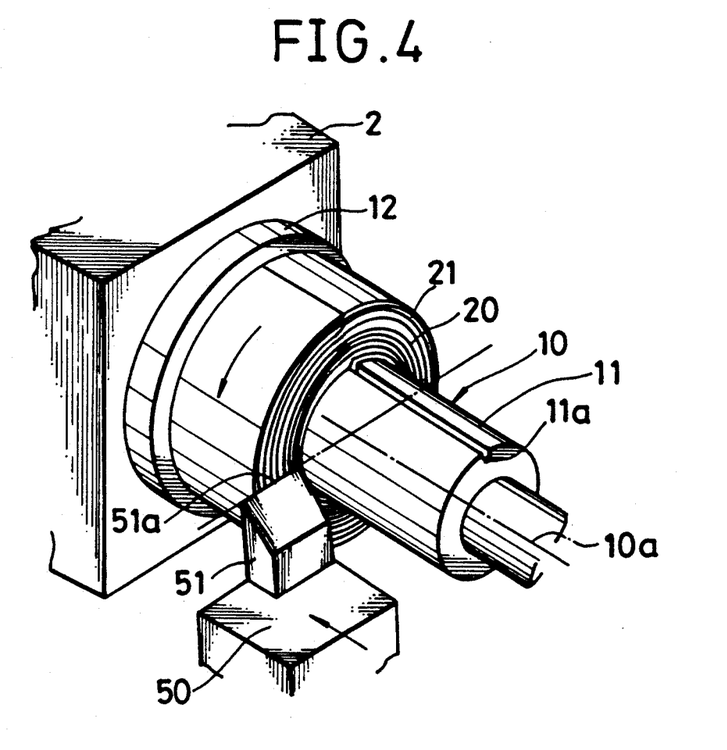
FIG. 4 is a perspective view of the essential parts of the apparatus of FIG. 1.
Figure 5:
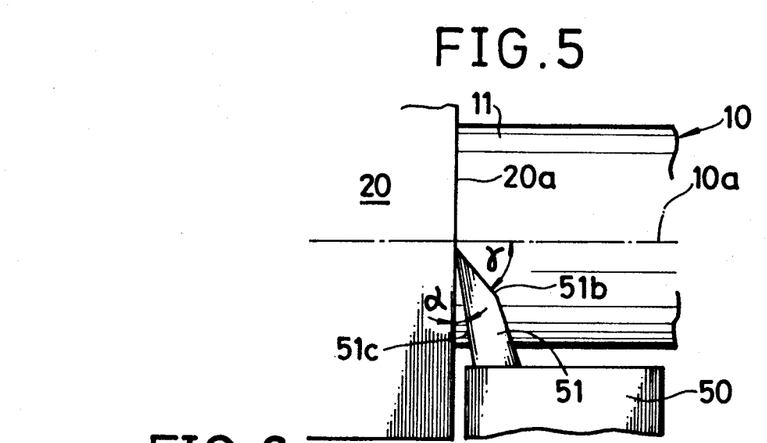
FIG. 5 is an enlarged view of the essential parts of the apparatus of FIG. 1.

As shown in FIGS. 4 and 5, a blade line 51a of the cutting blade 51 is perpendicular to an axis 10a of the rotary shaft 10, and the blade line 51a is on the center of an end surface (cutting surface) 20a of the laminate wound around the winding portion in the vertical direction. An angle (a rake angle) $\gamma$ between a cutting face 51b of the cutting blade 51 and the axis 10a ranges from 21° to 37°. An angle (an angle of relief) $\alpha$ between a flank 51c of the cutting blade 51 and the cutting surface 20a is about 10°.

Figure 6:
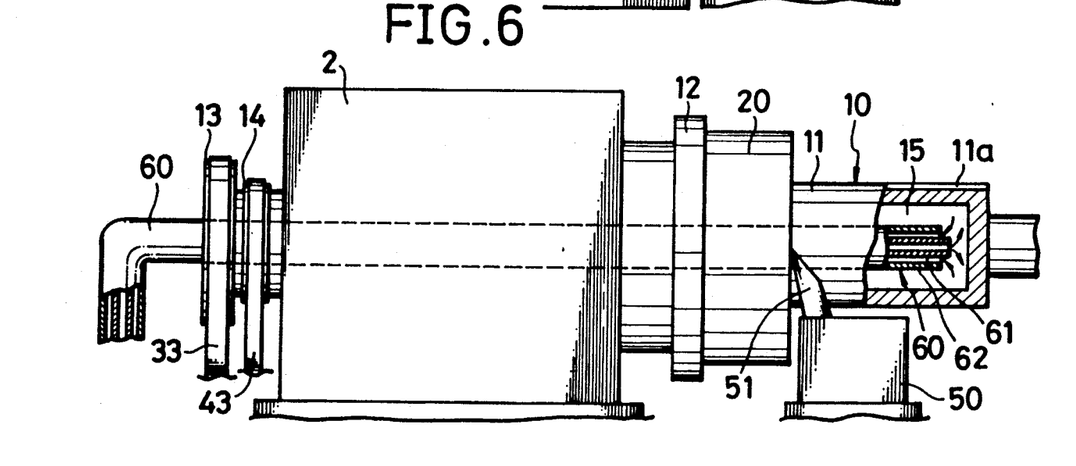
FIG. 6 is a side elevational view, with parts broken away, of the portion of the apparatus where the rotary shaft is accommodated.

The rotary shaft 10 has a cavity 15 therein. The cavity 15 extends from the end surface thereof to which the pulleys 13 and 14 are fixed to the winding portion 11, as shown in FIG. 6. A cooling pipe 60 is hermetically inserted into the cavity 15. The cooling pipe 60 is of dual construction and has an inner pipe 61 and an outer pipe 62. A cooling water is circulated in the cavity 15 by supplying it into the cavity 15 from the inner pipe 61 by the operation of a pump (not shown) and by sucking it into the outer pipe 62. This cooling structure is provided to prevent variations in the cutting conditions due to the heat generated during the cutting, e.g., variations in feeding amount due to the thermal expansion of the metal plate 20. The winding portion 11 of the rotary shaft 10 is specifically cooled by this cooling structure.

The operation of generating a fiber mixture by the cutting device S will be described.

First, the rotary shaft 10 is rotated counterclockwise as viewed in FIG. 3, i.e., in the direction opposite to that in which the laminate of the metal plate and the resin film is wound, at a fixed speed by operating the motor 30. The input shaft 41 of the reduction gear 40 is connected to the output shaft so as to rotate the feed screw 44 at a speed synchronized with the rotation of the rotary shaft 10 and thereby move the tool post 50 toward the cutting surface 20a of the laminate of the metal plate and the resin film wound around the winding portion along the guide rail 4 at a fixed speed. After the cutting blade 51 has come into contact with the cutting surface 20a, both the metal plate 20 and the resin film 21 are cut in accordance with the feeding of the cutting blade 51. Since the softening point of the resin film 21 is higher than the cutting temperature (the temperature of the cut portion due to the cutting heat), the resin film 21 is not softened during the cutting, and is thus cut into fine fibers together with the metal plate. In other words, during this cutting operation, a fiber mixture KS which contains brass fibers having a diameter of about 100 $\mu$m and phenolic resin fibers having a diameter of about 100 $\mu$m at substantially the same rate can be generated in sequence without interruption.

The amount of fiber mixture KS which is manufactured is substantially proportional to the cutting width (amount of the laminate wound), the feeding of the cutting blade (mm/rev), and the cutting speed (m/rev). For example, the amount of fiber mixture manufactured can be doubled by doubling the feeding of the cutting blade.

Furthermore, in order to achieve excellent cutting, the aforementioned rake angle $\gamma$ of the cutting blade 51 must be selected adequately.

Tables 1 and 2 show the results of the experiments conducted to examine the state of generation of the fiber mixture KS and reduction in the rotational speed of the rotary shaft 10 at various rake angles of the cutting blade 51. The experiments were conducted at two feeding rates of the cutting blade of 0.01 mm/rev (Table 1) and 0.02 mm/rev (Table 2), respectively. The rotational speed of the rotary shaft 10 was initially set to 150 rpm. Relief angle $\alpha$ of the cutting blade 51 and cutting width of the laminate were fixed to 10° and 13 mm, respectively. In the experiments, a laminate of the metal plate 20 and the resin film 21 to be subject to the cutting operation was the one which was wound on the winding portion 11 having a diameter of 150 mm until of 150 mm until the diameter thereof became 180 mm.

TABLE 1

| | (feeding: 0.01 mm/rev) | |
|---|---|---|
| Rake Angle $\gamma$ (°) | Generated state | Reduction in the rotational speed |
| 20 or less | Not good | Great |
| 21 to 25 | Fair | Substantial |
| 26 to 34 | Good | Substantial |
| 35 | Excellent | Small |
| 36, 37 | Good | Small |
| 38 or above | Not good | Small |

TABLE 2

| | (feeding: 0.02 mm/rev) | |
|---|---|---|
| Rake Angle $\gamma$ (°) | Generated state | Reduction in the rotational speed |
| 20 or less | Not good | Great |
| 21 to 25 | Fair | Great |
| 26 to 34 | Good | Substantial |
| 35 | Excellent | Small |
| 36, 37 | Good | Small |
| 38 or above | Not good | Small |

As seen from Tables 1 and 2, in the case of the feeding of 0.01 mm/rev, when the rake angle $\gamma$ was 20° or less, the fibers of the same type were melted with each other and short fibers were generated due to the increase in the cutting resistance and the heat generated as a consequence of increase of the cutting resistance. Also, the rotational speed of the rotary shaft decreased greatly. When the rake angle γ was 38° or above, although the rotational speed did not decrease greatly, chattering occurred during the cutting. This made generation of long fibers difficult. When the rake angle γ was between 21° and 37°, although the rotational speed decreased and the generated fibers were not sufficiently flexible in the range of smaller rake angle, almost excellent fiber mixture KS was generated. Particularly, when the rake angle γ was 35°, the most excellent fiber mixture KS was obtained. In the case of the feeding of 0.02 mm/rev, the same results were obtained with the slight difference in the reduction of the rotational speed.

Next, the heating device K will be described with reference to FIG. 1.

The heating device K is capable of heating the fiber mixture KS generated by the cutting device S to a temperature at which the fiber resins can be softened, e.g., about 200° C. The heating device K includes a passage 71 for the fiber mixture and an infrared heater 72 disposed such that it faces the passage 71. Although not shown, the temperature of the interior of the passage 71 is maintained to a substantially fixed value by a power source circuit coupled to a temperature sensor.

The fiber mixture KS generated in the cutting device S is pulled by a winder (not shown) provided at the outlet of the heating device K at the same speed at which it is generated by the cutting device and thereby passes through the passage 71. During the passage of the fiber mixture KS through the passage 71, the resin fibers are heated with the radiant heat generated by the infrared heater 72 to a temperature at which they are softened, by which the metal fibers are coupled to each other with the softened resin fibers as a binder. Since heating by the heating device K is completed in a short period of time, the softened thermosetting resin fibers are not hardened through chemical reaction.

Figure 7:
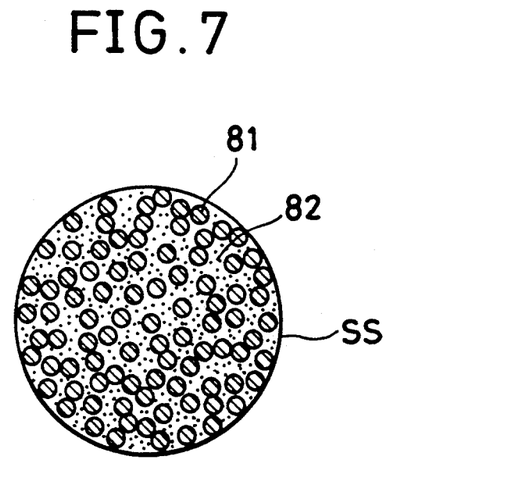
FIG. 7 is a cross-section of a molding material.

As stated above, in the fiber mixture KS, the metal fibers and the resin fibers having the same diameter are present substantially at the same ratio and in a very closely contacted state. In consequence, the heating operation provides for a bar-shaped molding material SS in which brass metal fibers 81 are substantially uniformly dispersed in a contacted state in a phenolic resin material 82 which is not yet hardened, and which has the contents of metal fibers of about 50% by volume.

When the casings or the like having electromagnetic wave shielding function are to be manufactured using the thus-obtained molding material SS, the molding material SS is cut into a predetermined length and is thereby formed into pellets. These master pellets containing the metal fibers or the mixture obtained by mixing these master pellets and the natural pellets of the same resin is then molded into a predetermined form using an adequate molding machine or a die.

Since the molding material SS has a form in which the metal fibers 81 are substantially uniformly dispersed in the resin material 82, cracking of the resin material or removal of the metal fibers does not occur during the cutting performed to obtain the master pellets. When the master pellets are to be mixed with the natural pellets, the metal fibers can be dispersed in the resultant mixture with a sufficient extent, which leads to provision of desirably conductive molded articles. Furthermore, since the length of the metal fibers which are present in the master pellets obtained by cutting the molding material SS into a predetermined length is equal to that of the pellets, the metal fibers are present in the molded articles in a sufficiently coupled or intertwined state with each other, This greatly improves the conductivity of the molded articles.

The above-described cutting method is capable of cutting metals having various hardnesses regardless of the strength of the metal employed, enabling the use of a metal plate 20 which is made of iron, copper, stainless steel or titanium, in addition to brass. Furthermore, since a desired softening temperature can be obtained by changing the heating temperature, thermosetting resins other than the phenolic resin, e.g., a urea or polyester resin, can also be employed to form the resin film 21. A thermoplastic resin, such as polystyrene, a polyethylene or polycarbonate, may also be employed.

The type of metal fibers or resin fibers contained in the fiber mixture KS and the combination thereof can be freely selected by changing the type of metal plate 20 and that of resin film 21 employed.

The rate at which the metal fibers and resin fibers are contained in the fiber mixture KS, i.e., the contents of the metal fibers by volume in the molding material SS, can be adjusted by changing the rate at which the metal plate 20 and the resin film 21 are wound around the rotary shaft 10 or by changing the thickness of the metal plate 20 and of the resin film 21 to be wound around the rotary shaft 10.

Furthermore, the thickness of the metal fibers contained in the fiber mixture KS can be arbitrarily adjusted by changing the thickness of the metal plate 20 or the feeding of the cutting blade 51. For example, a molding material SS containing finer metal fibers will be obtained by using a thinner metal plate 20 or by reducing the feeding of the cutting blade 51.

Furthermore, the metal plate 20 with the resin material interposed therebetween may be obtained by placing the resin film 21 on one surface or two surfaces of the metal plate 20 or by forming a film of the same resin on one surface or two surfaces of the metal plate by coating, dipping or spraying, the obtained metal plate 20 being wound around the winding portion 11. In that case, the material to be cut is a single sheet of plate, so the winding operation can be simplified.

Furthermore, in a case where the fiber mixture KS which is fed from the cutting device S to the heating device K is converged in a loose state, rollers or an orifice may be provided between the two devices. Alternatively, heating plates or heating rolls may be employed in place of the infrared heater 72.

In the above-described embodiment, the fiber mixture KS generated by the cutting device S is heated by the heating device K so as to soften the resin fibers contained in the fiber mixture. However, softening of the resin fibers may also be conducted without using the heating device K as described below.

When a resin having a softening point lower than the cutting temperature (the temperature of the cutting portion due to the cutting heat) is used as the resin material to be interposed between the metal plate 20, the resin may be softened due to the heat generated when the end surface of the materials wound is cut. In that case, the metal fibers are coupled with each other with the softened resin material as a binder substantially concurrently with the cutting.

The metal fibers which are coupled with each other by the resin material are gathered by rollers or an orifice before the resin material has become hard to obtain a molding material which is close to that obtained in the above-described embodiment.

What is claimed is:

1. A method of manufacturing a molding material containing metal fibers dispersed within a resin comprising the steps of:
   winding a metal strip on the peripheral surface of a rotary shaft a plurality of turns while providing a resin material between successive layers of said metal strips to produce a cylindrical composite comprising a laminate of alternating layers of said metal strip and said resin material, said cylindrical composite having an exposed end surface;
   placing a cutting blade against said exposed end surface while rotating said rotary shaft to form a mixture of metal fibers and resin fibers, said cutting blade having a rake angle between about 21° and about 37°; and,
   heating the resulting mixture of metal fibers and resin fibers to soften the resin and form a molding material comprising metal fibers dispersed within a resin.

2. A method of manufacturing a molding material according to claim 1, wherein said metal strip is made of a metal selected from a group consisting of brass, iron, copper, stainless steel and titanium.

3. A method of manufacturing a molding material according to either of claims 1 or 2, wherein said resin material comprises a resin film formed on at least one surface of said metal strip before said metal strip is wound on said rotary shaft.

4. A method of manufacturing a molding material according to either of claims 1 or 2, wherein said resin material comprises a resin film coated on at least one surface of said metal strip before said metal strip is wound on said rotary shaft.

5. A method of manufacturing a molding material according to either of claims 1 or 2, wherein said resin material is a thermosetting resin which is selected from a group consisting of a phenolic resin, a urea resin and a polyester.

6. A method of manufacturing a molding material according to either of claims 1 or 2, wherein said resin material is a thermoplastic resin which is selected from a group consisting of polystyrene, a polyethylene, and polycarbonate.

7. A method of manufacturing a molding material containing metal fibers and resin fibers, comprising the steps of:
   winding a metal strip on the peripheral surface of a rotary shaft a plurality of turns while interposing a resin material that can be softened by cutting heat between successive windings of said metal strip to produce a cylindrical composite comprising alternating layers of said metal strip and said resin material, said cylindrical composite having an exposed end surface; and,
   placing a cutting blade against said exposed end surface while rotating said rotary shaft so as to form a mixture of metal fibers and resin fibers, said cutting blade having a rake angle between about 21° and about 37°.

8. A method of manufacturing a molding material according to claim 7, wherein said metal strip is made of a metal selected from a group consisting of brass, iron, copper, stainless steel and titanium.

9. A method of manufacturing a molding material according to either of claims 7 or 8, wherein said resin material comprises a resin film laminated on at least one surface of said metal strip before said metal strip is wound on said rotary shaft.

10. A method of manufacturing a molding material according to either of claims 7 or 8, wherein said resin material comprises a resin film coated on one surface or two surfaces of said metal strip beforehand.

11. A method of manufacturing a molding material according to either of claims 7 or 8, wherein said resin material is a thermosetting resin which is selected from a group consisting of a phenolic resin, a urea resin and a polyester.

12. A method of manufacturing a molding material according to either of claims 7 or 8, wherein said resin material is a thermoplastic resin which is selected from a group consisting of polystyrene, a polyethylene, and polycarbonate.

* * * * *